（12） United States Patent
Hadar et al.

(10) Patent No.: US 10,312,857 B2
(45) Date of Patent: *Jun. 4, 2019

(54) SYSTEMS AND METHODS FOR AN ENHANCED WATCHDOG IN SOLAR MODULE INSTALLATIONS

(71) Applicant: Tigo Energy, Inc., Los Gatos, CA (US)

(72) Inventors: Ron Hadar, Cupertino, CA (US); Shmuel Arditi, Discovery Bay, CA (US)

(73) Assignee: Tigo Energy, Inc., Los Gatos, CA (US)

( * ) Notice: Subject to any disclaimer, the term of this patent is extended or adjusted under 35 U.S.C. 154(b) by 688 days.

This patent is subject to a terminal disclaimer.

(21) Appl. No.: 14/572,458

(22) Filed: Dec. 16, 2014

(65) Prior Publication Data

US 2015/0101651 A1    Apr. 16, 2015

Related U.S. Application Data

(63) Continuation of application No. 12/628,977, filed on Dec. 1, 2009, now Pat. No. 8,933,321.

(Continued)

(51) Int. Cl.
*H02S 50/10* (2014.01)
*H02S 40/32* (2014.01)
(Continued)

(52) U.S. Cl.
CPC .......... *H02S 50/10* (2014.12); *H01L 31/02021* (2013.01); *H01L 31/052* (2013.01);
(Continued)

(58) Field of Classification Search
CPC ......... H01L 31/02021; H01L 31/02008; H01L 31/042052; H02S 40/32; H02S 40/34;
(Continued)

(56) References Cited

U.S. PATENT DOCUMENTS 5,801,519 A    9/1998  Midya et al.
6,713,890 B2   3/2004  Kondo et al.
(Continued)

FOREIGN PATENT DOCUMENTS

DE    102007050031    4/2009
EP       2495766       9/2012
(Continued)

OTHER PUBLICATIONS

Title: Apparatuses and Methods to Reduce Safety Risks Associated with Photovoltaic Systems, U.S. Appl. No. 12/948,614, filed Nov. 17, 2010, Inventor(s): Earl Powell, et al, Status: Docketed New Case—Ready for Examination, Status Date: Oct. 5, 2016.

(Continued)

*Primary Examiner* — Matthew T Martin
(74) *Attorney, Agent, or Firm* — Greenberg Traurig, LLP

(57) ABSTRACT

Systems and methods for automatically or remotely rendering a solar array safe during an emergency or maintenance. A watchdog unit is disclosed for monitoring a signal from a central controller. If the signal is lost, interrupted, or becomes irregular, or if a shutdown signal is received, then the watchdog unit can shut down one or more solar modules. Shutting down a solar module can mean disconnecting it from a power bus of the solar array or lowering the solar module voltage to a safe level.

5 Claims, 5 Drawing Sheets

Related U.S. Application Data

(60) Provisional application No. 61/275,977, filed on Sep. 3, 2009, provisional application No. 61/276,753, filed on Sep. 16, 2009.

(51) Int. Cl.
| | |
|---|---|
| *H01L 31/02* | (2006.01) |
| *H02S 40/34* | (2014.01) |
| *H01L 31/052* | (2014.01) |
| *H02S 50/00* | (2014.01) |
| *H02S 50/15* | (2014.01) |

(52) U.S. Cl.
CPC .............. *H02S 40/32* (2014.12); *H02S 40/34* (2014.12); *H02S 50/00* (2013.01); *H02S 50/15* (2014.12); *Y02E 10/50* (2013.01)

(58) Field of Classification Search
CPC .......... H02S 50/00; H02S 50/10; H02S 50/15; H02S 50/32; H02S 50/34
See application file for complete search history.

(56) References Cited

U.S. PATENT DOCUMENTS

| | | |
|---|---|---|
| 6,819,011 B2 | 11/2004 | Kernahan et al. |
| 6,946,753 B2 | 9/2005 | Kernahan et al. |
| 8,013,472 B2 | 9/2011 | Adest et al. |
| 8,035,249 B2 | 10/2011 | Shaver, II et al. |
| 8,212,139 B2 | 7/2012 | Meyer |
| 8,427,009 B2 | 4/2013 | Shaver, II et al. |
| 8,531,055 B2 | 9/2013 | Adest et al. |
| 8,563,847 B2 | 10/2013 | Meyer et al. |
| 8,587,151 B2 | 11/2013 | Adest et al. |
| 8,669,675 B2 | 3/2014 | Capp et al. |
| 8,816,535 B2 | 8/2014 | Adest et al. |
| 8,828,778 B2 | 9/2014 | Meyer |
| 8,933,320 B2 | 1/2015 | Meyer |
| 8,933,321 B2 | 1/2015 | Hadar et al. |
| 8,947,194 B2 | 2/2015 | Sella et al. |
| 9,112,379 B2 | 8/2015 | Sella et al. |
| 9,377,765 B2 | 6/2016 | Makhota et al. |
| 9,397,612 B2 | 7/2016 | Hadar et al. |
| 9,401,599 B2 | 7/2016 | Har-Shai et al. |
| 9,438,035 B2 | 9/2016 | Capp et al. |
| 9,543,890 B2 | 1/2017 | Meyer et al. |
| 9,590,526 B2 | 3/2017 | Adest et al. |
| 9,768,725 B2 | 9/2017 | Meyer |
| 9,813,021 B2 | 11/2017 | Hadar et al. |
| 10,063,056 B2 | 8/2018 | Makhota et al. |
| 2009/0183760 A1* | 7/2009 | Meyer ............... H01L 31/02 008 136/244 |
| 2009/0183763 A1* | 7/2009 | Meyer ............... H01L 31/02 021 136/246 |
| 2009/0141522 A1 | 10/2009 | Baird et al. |
| 2010/0071274 A1 | 3/2010 | Brescia |
| 2010/0085670 A1 | 4/2010 | Palaniswami et al. |
| 2010/0131108 A1 | 5/2010 | Meyer |
| 2010/0282293 A1 | 11/2010 | Meyer et al. |
| 2010/0283612 A1 | 11/2010 | Wong et al. |
| 2010/0300508 A1 | 12/2010 | Maier et al. |
| 2011/0068702 A1 | 3/2011 | Van De Ven et al. |
| 2012/0234374 A1 | 9/2012 | Meyer |
| 2014/0035373 A1 | 2/2014 | Meyer et al. |
| 2015/0028692 A1 | 1/2015 | Makhota et al. |
| 2015/0047689 A1 | 2/2015 | Meyer |
| 2015/0053250 A1 | 2/2015 | Hadar et al. |
| 2016/0301214 A1 | 10/2016 | Makhota et al. |
| 2016/0315585 A1 | 10/2016 | Hadar et al. |
| 2017/0085094 A1 | 3/2017 | Meyer et al. |
| 2018/0019705 A1 | 1/2018 | Hadar et al. |
| 2018/0351365 A1 | 12/2018 | Makhota et al. |

FOREIGN PATENT DOCUMENTS

| | | |
|---|---|---|
| WO | 2008077473 | 7/2008 |
| WO | 2009006879 | 1/2009 |

OTHER PUBLICATIONS

Title: Systems and Methods for Remote or Local Shut-off of a Photovoltaic System, U.S. Appl. No. 13/073,915, filed Mar. 28, 2011, Inventor(s): Maxym Makhota, et al, Status: Final Rejection Mailed, dated Nov. 29, 2013.

Title: Systems and Methods for Remote or Local Shut-off of a Photovoltaic System, U.S. Appl. No. 14/503,723, filed Oct. 1, 2014, Inventor(s): Maxym Makhota, et al, Status: Docketed New Case— Ready for Examination, Status Date: Dec. 10, 2014.

Title: Systems and Methods for Remote or Local Shut-off of a Photovoltaic System, U.S. Appl. No. 15/186,330, filed Jun. 17, 2016, Inventor(s): Maxym Makhota, et al, Non Final Action Mailed, dated May 19, 2017.

Title: System and Method for Enhanced Watch Dog in Solar Panel Installations, U.S. Appl. No. 13/092,783, filed Apr. 22, 2011, Inventor(s): Ron Hadar, et al, Status: Non Final Action Mailed, dated Nov. 5, 2013.

Title: System and Method for Enhanced Watch Dog in Solar Panel Installations, U.S. Appl. No. 14/473,659, filed Aug. 29, 2014, Ron Hadar, et al., Status: Non Final Action Mailed, dated Oct. 5, 2015.

Title: System and Method for Enhanced Watch Dog in Solar Panel Installations, U.S. Appl. No. 15/203,713, filed Jul. 6, 2016, Status: Non Final Action Mailed, dated Mar. 6, 2017.

European Patent Application No. 11772811.3, Extended Search Report, dated Dec. 15, 2014.

Title: Apparatuses and Methods to Reduce Safety Risks Associated with Photovoltaic Systems, U.S. Appl. No. 12/254,780, filed Oct. 20, 2008, Inventor(s): Earl Powell, et al., U.S. Pat. No. 7,884,278, Issue Date: Feb. 8, 2011.

Title: Apparatuses and Methods to Reduce Safety Risks Associated with Photovoltaic Systems, U.S. Appl. No. 12/366,597, filed Feb. 5, 2009, Inventor(s): Earl Powell, et al, U.S. Pat. No. 7,807,919, Issue Date: Oct. 5, 2010.

Title: Apparatuses and Methods to Reduce Safety Risks Associated with Photovoltaic Systems, U.S. Appl. No. 12/948,614, filed Nov. 17, 2010, Inventor(s): Earl Powell, et al, Status: Non Final Action Mailed, dated May 31, 2017.

Title: Systems and Methods for Remote or Local Shut-off of a Photovoltaic System, U.S. Appl. No. 13/073,915, filed Mar. 28, 2011, Inventor(s): Maxym Makhota, et al, U.S. Pat. No. 8,854,193, Issue Date: Oct. 7, 2014.

Title: Systems and Methods for Remote or Local Shut-off of a Photovoltaic System, U.S. Appl. No. 14/503,723, filed Oct. 1, 2014, Inventor(s): Maxym Makhota, et al, U.S. Pat. No. 9,377,765, Issue Date: Jun. 28, 2016.

Title: Systems and Methods for Remote or Local Shut-off of a Photovoltaic System, U.S. Appl. No. 15/186,330, filed Jun. 17, 2016, Inventor(s): Maxym Makhota, et al, Status: Non Final Action Mailed, dated May 19, 2017.

Title: Systems and Methods for an Enhanced Watchdog in Solar Module Installations, U.S. Appl. No. 12/628,977, filed Dec. 1, 2009, Inventor(s): Ron Hadar, et al, U.S. Pat. No. 8,933,321, Issue Date: Jan. 13, 2015.

Title: System and Method for Enhanced Watch Dog in Solar Panel Installations, U.S. Appl. No. 13/092,783, filed Apr. 22, 2011, Inventor(s): Ron Hadar, et al, U.S. Pat. No. 8,823,218, Issue Date: Sep. 2, 2014.

Title: System and Method for Enhanced Watch Dog in Solar Panel Installations, U.S. Appl. No. 14/473,659, filed Aug. 29, 2014, Inventor(s): Ron Hadar, et al, U.S. Pat. No. 9,397,612, Issue Date: Jul. 19, 2016.

Title: System and Method for Enhanced Watch Dog in Solar Panel Installations, U.S. Appl. No. 15/203,713, filed Jul. 6, 2016, Inventor(s): Ron Hadar, et al, Status: Notice of Allowance Mailed— Application Received in Office of Publications, dated Jun. 21, 2017.

(56) References Cited

OTHER PUBLICATIONS

Title: System and Method for Enhanced Watch Dog in Solar Panel Installations, U.S. Appl. No. 15/717,244, filed Sep. 27, 2017, Inventor(s): Ron Hadar, et al, Status: Application Dispatched from Preexam, Not Yet Docketed, Status Date: Oct. 12, 2017.

* cited by examiner

SYSTEMS AND METHODS FOR AN ENHANCED WATCHDOG IN SOLAR MODULE INSTALLATIONS

RELATED APPLICATIONS

The present application is a continuation application of U.S. patent application Ser. No. 12/628,977, filed Dec. 1, 2009, issued as U.S. Pat. No. 8,933,321 on Jan. 13, 2015 and entitled "Systems and Methods for an Enhanced Watchdog in Solar Module Installations", which claims the benefit of filing dates of Prov. U.S. App. Ser. No. 61/275,977, filed Sep. 3, 2009 and entitled "System and Method for Enhanced Watch Dog in Solar Panel Installations," and Prov. U.S. App. Ser. No. 61/276,753, filed Sep. 16, 2009 and entitled "System and Method for Enhanced Watch Dog in Solar Panel Installations," the entire disclosures of which applications are hereby incorporated herein by reference.

The present application relates to U.S. Pat. No. 7,807,919, issued Oct. 5, 2010 and entitled "Apparatuses and Methods to Reduce Safety Risks Associated with Photovoltaic Systems," which has a continuation application published as U.S. Pat. App. Pub. No. 2011/0061713 with a title of "Apparatuses and Methods to Reduce Safety Risks Associated with Photovoltaic Systems," and U.S. Pat. No. 7,602,080, issued Oct. 13, 2009 and entitled "Systems and Methods to Balance Solar Panels in a Multi-Panel System," the entire disclosures of which applications are hereby incorporated herein by reference. The present application further relates to U.S. Pat. No. 8,823,218, issued Sep. 2, 2014 and entitled "System and Method for Enhanced Watch Dog in Solar Panel Installations", which has a continuation application filed on Aug. 29, 2014 as U.S. patent application Ser. No. 14/473,659, issued as U.S. Pat. No. 9,397,612 on Jul. 19, 2016 with a title of "System and Method for Enhanced Watch Dog in Solar Panel Installations."

FIELD OF THE TECHNOLOGY

At least some embodiments of the disclosure relate to photovoltaic systems in general, and more particularly but not limited to, improving the safety of photovoltaic systems.

BACKGROUND

First responders, solar array installers, and maintenance personnel operating near solar arrays can be exposed to dangerous or lethal voltages. The danger can be even higher if certain wires are disconnected through theft, vandalism, accident, natural forces, or other causes. To protect first responders, solar array installers, and maintenance personnel, solar arrays can be turned off in an emergency. However, the systems used to turn off a solar array in an emergency can also be disabled by the emergency (e.g., fire).

SUMMARY OF THE DESCRIPTION

Systems and methods in accordance with the present invention are described herein. Some embodiments are summarized in this section. The present disclosure relates to systems, methods, and apparatus for shutting down a photovoltaic energy generating unit when communication with a central controller is interrupted. In one approach a solar array may include a watchdog unit able to disconnect a solar module from a power bus, or lower the solar module voltage to a safe level, when communication from the central controller is interrupted. Disconnecting the solar module, or lowering the solar module voltage, may be performed by opening a switchable connection or lowering a duty cycle of the switchable connection. Either of these operations can be controlled by a controller within the watchdog unit. In an embodiment, the watchdog unit may lose power or not have access to its primary energy source (e.g., due to fire, vandalism, or malfunction, to name a few). In such an instance the watchdog unit may turn to a backup energy source (e.g., battery or capacitor).

One aspect of the disclosure is a system comprising a watchdog unit coupled between a solar module and a power bus. The watchdog unit may be configured to monitor communication from a central controller. The watchdog unit may also be configured to determine that the communication is interrupted. The watchdog unit may also be configured to disconnect the solar module from the power bus when the communication is interrupted.

Another aspect of the disclosure is a system comprising a watchdog device coupled between a solar module and a power bus. The watchdog device may be configured to verify communication with a central controller. The watchdog device may also be configured to shut down the solar module if communication with the central controller cannot be verified.

Another aspect of the disclosure is a computer-implemented method. The method includes monitoring, via a computing device, a signal from a central controller. The method includes determining, via the computing device, if the signal has been lost. The method includes disconnecting, via the computing device, one or more solar modules from a power bus if the signal has been lost. The method includes determining, via the computing device, if the signal includes a shutdown command. The method includes disconnecting, via the computing device, the one or more solar modules from the power bus if the signal includes a shutdown command. The method includes waiting, via the computing device, for a restart signal. The method includes connecting, via the computing device, the one or more solar modules to the power bus when the restart signal is received.

Other embodiments and features of the present invention will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Solar arrays can be shut down during an emergency, maintenance, or installation in order to protect first responders, solar array installers, and maintenance personnel from shock or electrocution. However, systems used to shut down a solar array can also be damaged in an emergency. The systems and methods herein disclosed can shut down a solar array or lower the voltages to safe levels even when the solar array is damaged or when an active shutdown signal is sent to the solar array. Specifically, a watchdog unit is disclosed that monitors communication from a central controller, and upon interruption of that communication, disconnects a solar module from a power bus. Alternatively, when communication is interrupted, the watchdog unit can lower the solar module voltage to a safe level. The systems and methods also describe a watchdog unit able to receive a shutdown signal, which would allow first responders, solar array installers, and maintenance personnel to remotely render the solar array safe before approaching the solar array. In the event that the watchdog unit loses power, backup sources of power are also described.

Figure 1:
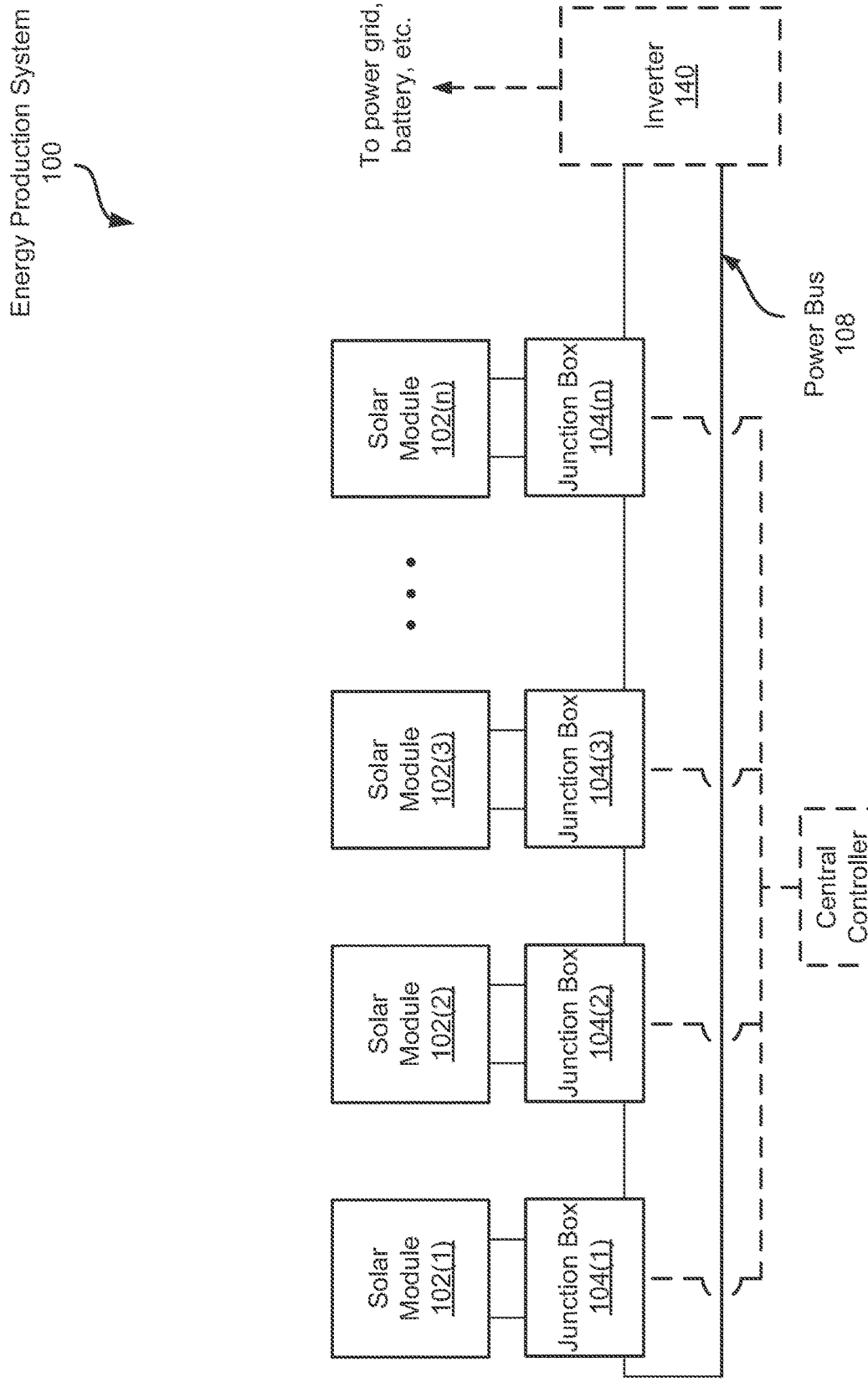
FIG. 1 illustrates an embodiment of an energy production system including a plurality of junction boxes each coupled between a solar module and a power bus.

FIG. 1 illustrates an embodiment of an energy production system 100 including a plurality of junction boxes 104 each coupled between a solar module 102 and a power bus 108. The solar modules 102 generate power from absorbed photons and provide this power to the power bus 108. The junction boxes 104 control the voltage provided by the solar modules 102 to the power bus 108. In an embodiment, this is done via control of one or more switchable connections within the junction boxes 104. Junction boxes 104 can disconnect the solar modules 102 from the power bus 108 or lower the voltage provided to the power bus 108. The junction boxes 104 may each comprise a watchdog unit. Each watchdog unit can monitor a communication (or signal) from a central controller 106 via wireless or wired connection. When the communication is interrupted, each watchdog unit can render its associated solar module 102 safe by disconnecting the solar module 102 from the power bus 108 or by lowering the solar module 202 voltage to a safe level.

Power from the solar modules 102 can be converted to alternating current (AC) power via an optional inverter 140, and then provided to the power grid, a battery, or other load. Given a direct current (DC) load, the inverter may be left out. The power bus 108 may be connected in parallel or series with other power buses in a combiner box (not illustrated) before the combined power is provided to the inverter 140 or a (DC) load.

Watchdog units may also be configured to respond to a shutdown signal. Upon receiving a shutdown signal from the central controller 106, the watchdog units may disconnect the solar modules 102 from the power bus 108, or they may lower the solar module 102 voltages to a safe level. The shutdown signal can be automatically generated within the central controller 106 or some other controller in communication with the central controller 106. Alternatively, the shutdown signal can be manually generated. For instance, a solar array maintenance worker may push a button connected to the central controller initiating shutdown of all solar modules so that the worker can do maintenance on the solar array without worrying about shock or electrocution.

The location of the central controller 106 is non-limiting. The central controller 106 may be remote. The central controller 106 may be a part of a combiner box or inverter 140. The central controller 106 may be a part of one of the junction boxes 104.

Although FIG. 1 illustrates a junction box 104 for each solar module 102, other embodiments may have solar modules 102 that are coupled directly to the power bus without a junction box 104. Furthermore, even where there is a junction box 104 coupled between each solar module 102 and the power bus 108, there may not be a watchdog unit in every junction box 104.

A "solar cell" is a photovoltaic device configured to absorb photons and convert them into electrical energy. A "solar module" is a device that includes at least one or more solar cells, wherein the solar cells are connected in series or in parallel. The solar cells absorb photons and convert the photons into electrical energy. A "power bus" is a conductive path connecting one or more solar modules 102 in series. A "watchdog unit" is a device or software implemented in hardware configured to monitor a communication from a central controller 106 and shut down, or disconnect from the power bus 108, a solar module 102 when the communication from the central controller 106 is interrupted or when a shutdown signal is received. A "signal" is an electric quantity (voltage or current or field strength) whose modulation represents coded information.

Figure 2:
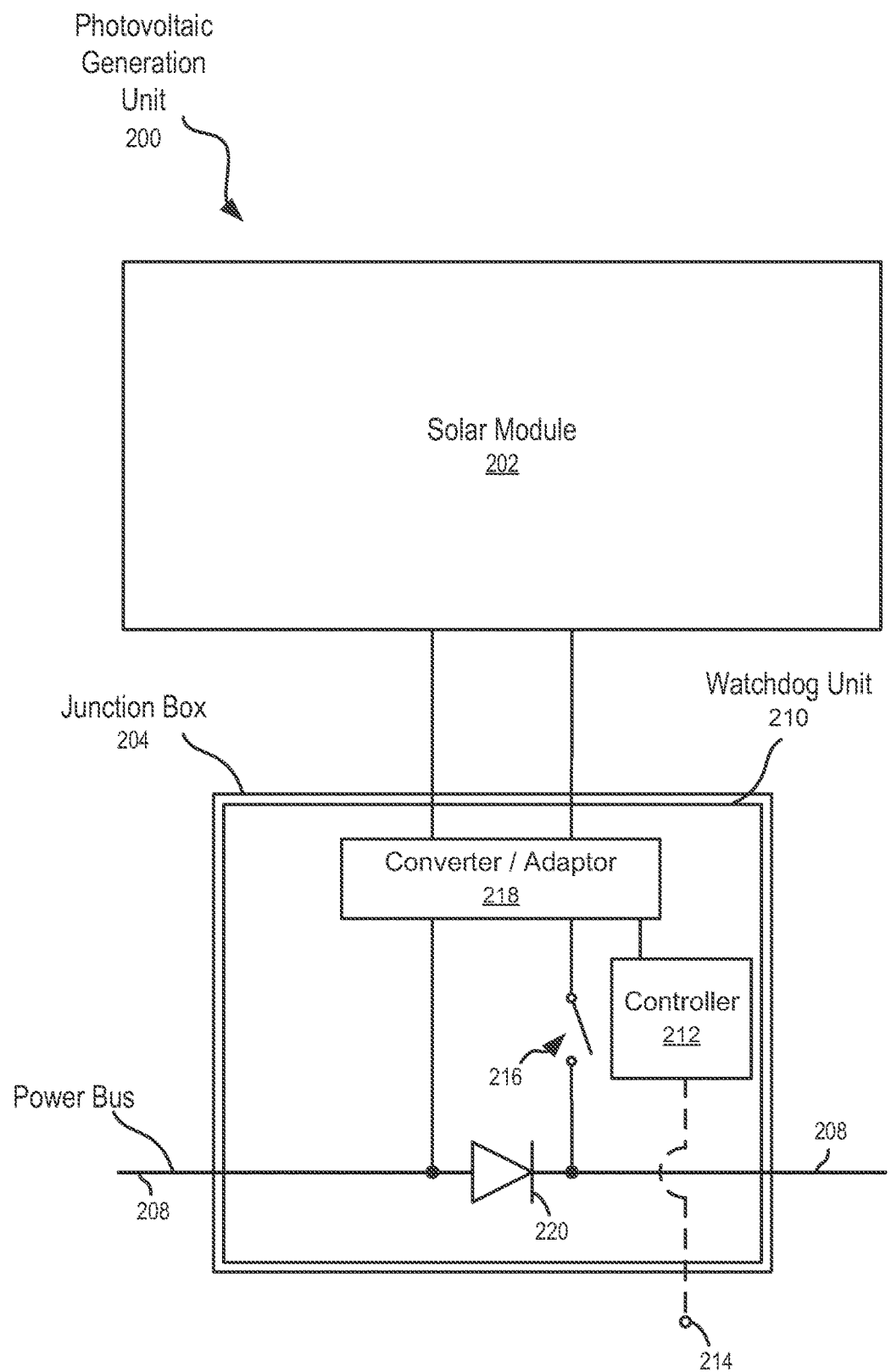
FIG. 2 illustrates a solar module and a detail view of an embodiment of a junction box.

FIG. 2 illustrates a solar module 202 and a detail view of an embodiment of a junction box 204. The junction box 204 may be coupled between a solar module 202 and a power bus 208. The junction box 204 may include a controller 212 and may include a switchable connection 216 (or two or more switchable connections 216). The junction box 204 optionally includes a converter/adaptor 218 and/or optionally includes a diode 220. The junction box 204 may include a watchdog unit 210. The watchdog unit 210 may be configured to monitor a communication from the central controller 106, determine that the communication has been interrupted, and disconnect the solar module 202 from the power bus 208 or lower the solar module 202 voltage to a safe level.

The watchdog unit 210 may be configured to monitor a communication from the central controller 106 via a connection 214. The connection 214 can be wired or wireless. For a wireless communication, the watchdog unit 210 may be implemented in software. For a communication arriving via a wired connection, the watchdog 210 may be implemented in hardware. However, the watchdog unit 210 for monitoring the wired communication may also be implemented in software or in a hardware-software combination. The watchdog unit 210 for monitoring the wireless communication may also be implemented in hardware or in a hardware-software combination. The communication can take any form that can be recognized by the watchdog unit 210. For instance, the communication can be continuous or pulsed, or periodic or non-periodic.

There are numerous reasons that communication may be interrupted. For instance, the central controller 106 may fail to send a communication or the connection 214 (wired or wireless) between the central controller 106 and the watchdog unit 210 may be severed by fire, accident, or malfunction, to name a few. Whatever the cause of the interruption (or interrupted fault), the watchdog unit 210 can determine that the communication has been interrupted. In response to determining that the communication has been interrupted, the watchdog unit 210 can render its associated solar module 202 safe by disconnecting the solar module 202 from the power bus 208 or by lowering the solar module 202 voltage to a safe level. Disconnecting the solar module 202 can be performed by, for instance, forcing the switchable connection 216 to operate in an open state. Lowering the solar module 202 voltage to a safe level can be performed by, for example, lowering the duty cycle of the switchable connection 216.

There are numerous ways to determine that a communication has been interrupted. For instance, given a pulsed communication, the watchdog unit 210 may look for loss of the pulses. The watchdog unit 210 may also look for an irregular periodicity to the pulses. The watchdog unit 210 may look for a decrease in the amplitude of the pulses. Whichever one or more of these the watchdog unit 210 looks for, it will also look to see that the irregular behavior has surpassed a threshold. For example, irregularity in the periodicity of the pulses may be identified when less than a threshold number of pulses are received that have an abnormal period. As another example, an interrupted communication may be one that has dropped below a certain threshold amplitude. As another example, an interrupted communication may be one that has been irregular for longer than a threshold period of time. In an embodiment, the watchdog unit 210 may look for a threshold of irregularity to be surpassed. These limited examples merely scratch the surface of the numerous qualities or parameters that can be monitored in order to determine that a communication has been interrupted.

While the watchdog unit 210 can be triggered by an interrupted communication, it can also be triggered by an instruction or other affirmative signal. For instance, the same communication that the watchdog unit 210 monitors for interruption, could also carry an indication (or instructions) to limit the voltage or disconnect (or shutdown) the solar module 202 from the power bus 208. In other words, the central controller 106 can be configured to transmit a repeated or continuous communication, but it can also be configured to transmit a limited-duration shutdown signal. The watchdog unit 210 can monitor the communication for an interruption or for a shutdown signal. The shutdown signal can be initiated by an automatic control in or of the central controller 106. The shutdown signal can also be manually initiated. The manually-initiated shutdown signal may be used by first responders, solar array installers, and maintenance personnel to remotely render the solar array safe. The manual input can be connected to the central controller 106 or can be remotely transmitted to the central controller 106.

The watchdog unit 210 can also be triggered by detecting a fault in: the power bus 208 wiring, wiring internal to the watchdog unit 210, or wiring internal to the junction box 204. A fault can be detected by comparing relevant voltages, or the absence of voltages between any one or more of the following: solar modules 202, power buses 208, or ground, to name a few. For instance, a fault can be detected by comparing relevant voltages, or the absence thereof, between the solar module 202 and the power bus 208. In another example, the relevant voltages, or absence thereof, could be compared between the solar module 202 and the ground.

As illustrated, the watchdog unit 210 is a part of the junction box 204. Alternatively, the watchdog unit 210 can be located outside the junction box 204. For instance, the watchdog unit 210 can be a part of the combiner box, the inverter 140, or any other location downstream from the junction box 204. The watchdog unit 210 can include any one or more of the following: the controller 212; one or more switchable connections 216; the converter/adaptor 218; and the diode 220. The watchdog unit 210 may lose power. For instance, the watchdog unit 210 may become disconnected from a primary power source (e.g., via fire). In an embodiment, the primary power source may include, for example, one or more of the following: the solar module 202, the power bus 206, a battery (not illustrated), or a capacitor (not illustrated). For instance, the watchdog unit 210 may be wired to draw power from either or both of the solar module 202 and the power bus 206. A backup power source can therefore provide the watchdog unit 210 with power when the watchdog unit's 210 primary power source is not available. In other words, the watchdog unit 210 can draw energy from a backup energy source when a primary energy source is not available.

The junction box 204 may include the controller 212. The controller 212 may monitor a communication from the central controller 106 via the wired/wireless connection 214. The wired/wireless connection 214 can also be seen in FIG. 1 as the dashed line leading from the central controller 106 to the solar modules 102. If the communication is interrupted, then the controller 204 may render the solar module 202 safe by either limiting the solar module 202 voltage or by disconnecting the solar module 202 from the power bus 208. The controller 204 can control the switchable connection 216 via a wired or wireless connection (not illustrated). The controller 204 can control the duty cycle of the switchable connection 216. Thus, the controller 204 can control the voltage that the solar module 202 provides to the power bus 208. The controller 204 can also disconnect the solar module 202 from the power bus 208 by leaving the switchable connection 216 in an open state. The controller 204 can be implemented in hardware, software, or a hardware-software combination. The controller 204 may derive instructions from a storage medium such as a non-volatile storage medium (e.g., electrically erasable programmable read-only memory (EEPROM), read-only memory (ROM), flash, to name a few). This allows the controller 204 to obtain instructions even when power has been lost.

The junction box 204 may include the switchable connection 216. The switchable connection 216 may connect and disconnect the solar module 202 to/from the power bus 208. The switchable connection 216 may be normally closed. When the switchable connection 216 is closed, the solar module 202 is connected to the power bus 208, and the entire voltage of the solar module 202 can be provided to the power bus 208. However, when the switchable connection 216 is opened, the solar module 202 may be disconnected from the power bus 208 and cannot provide voltage to the power bus 208. By opening and closing the switchable connection 216 at a particular duty cycle, a portion of the solar module's 202 voltage can be provided to the power bus 208, in essence lowering the solar module 202 voltage to a safe level. The switchable connection 216 can be mechanical or electrical (e.g., transistors). Non-limiting examples of electrical switches include field-effect transistors (FET), metal-oxide-semiconductor FETs (MOSFET), and insulated gate bipolar-type transistors (IGBT). The function of the switchable connection 216 may be carried out elsewhere (e.g., by the inverter 140).

The junction box 204 may include a converter/adaptor 218. The converter/adapter 218 acts as a local management unit ("LMU"). The LMUs may be configured to balance voltages and currents between solar modules 202 and between power buses 208. The converter/adapter can be implemented serially (as illustrated) or in parallel (not illustrated).

The junction box 204 may include an optional diode 220. The diode 220 can be coupled in series with the power bus 208 and coupled in parallel with the solar module 202. The diode 220 may be forward biased in the direction of the flow of current. As such, the diode 220 can reverse bias the solar module 202, should the solar module 202 stop producing power. The diode 220 can prevent reversal of the solar module 202 if there are one or more weak solar modules 202 on the power bus 208. Weak solar modules 202 are those that provide a lower current than other solar modules 202. The diode 220 may not be desired for an AC configuration since the diode 220 can rectify an AC power signal and thus reduce the power generated by the solar module 202.

Figure 3:
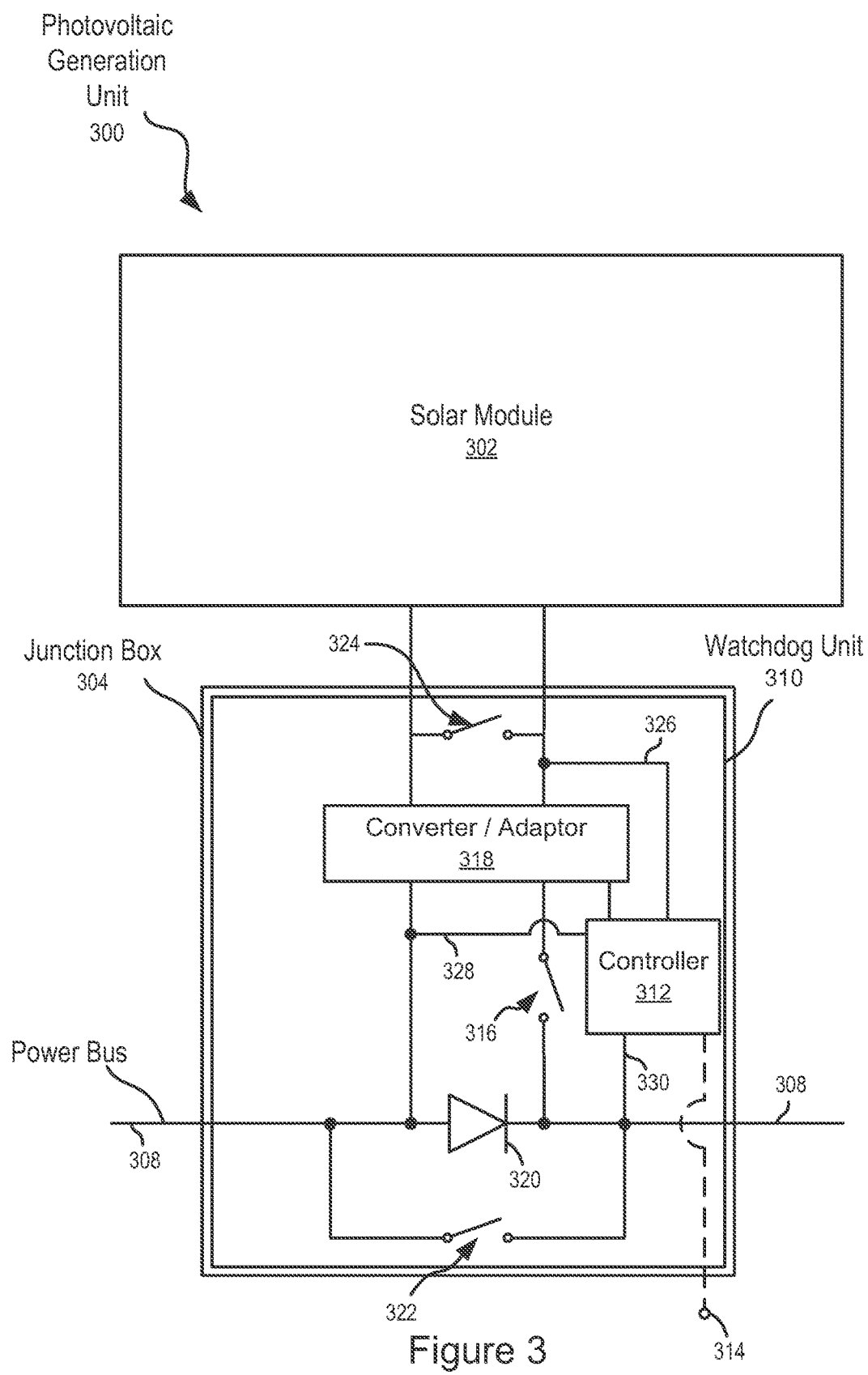
FIG. 3 illustrates an embodiment of a junction box.

FIG. 3 illustrates an embodiment of a junction box 304. This embodiment of a junction box 304 is similar to the junction box 204 illustrated in FIG. 2, but with the addition of optional switchable connections 322, 324 and optional lines 326, 328, 330.

The junction box 304 may include a bypass circuit such as the one formed by switchable connection 322. Since current may have to pass through the solar module 302 in order to pass downstream on the power bus 308, current may stop flowing in the power bus 308 if the watchdog unit 310 disconnects one of the solar modules 302 from the power bus 308. A bypass circuit, using the switchable connection 322, shorts the power bus 308 through the junction box 304 such that current in the power bus 308 can bypass the solar module 302. The switchable connection 322 may normally be open, but may close when the solar module 302 is disconnected from the power bus 308. The bypass circuit can be used in combination with a diode 320. The bypass circuit also allows current to pass through the junction box 304 without having to pass through the diode 320 or the solar module 302. The switchable connection 322 can be a mechanical or electronic switch. Non-limiting examples of electronic switches include FETs, MOSFETs, and IGBTs. The switchable connection 322 may not be desired in a high voltage system.

The junction box 304 may include a switchable connection 324, which can be used to increase the longevity of the solar module 302. The switchable connection 324 may be normally open. When closed, the switchable connection 324 can short the solar module 302 to itself. This may be done when the solar module 302 is disconnected from the power bus 308. In doing so, the solar module 302 can produce current, which may increase the solar module's 302 longevity. Shorting the solar module 302 is described in more detail in related U.S. Pat. No. 8,039,730, entitled "Systems and Methods for Prevention of Open Loop Damage during or Immediately after Manufacturing," which is incorporated herein by reference.

The junction box 304 may include a feed line 326 connecting the solar module 302 and the controller 312. The feed line 326 may be configured to provide the controller 312 with power when power is lost (e.g., when the controller 312 cannot obtain power from its primary power source). The junction box 304 may include a line 328 configured to provide power to the controller 312 from the solar module 302. The junction box 304 may include a line 330 configured to provide power to the controller 312 from the power bus 308. The controller 312 may also be powered by a batter or capacitor (not illustrated).

Figure 4:
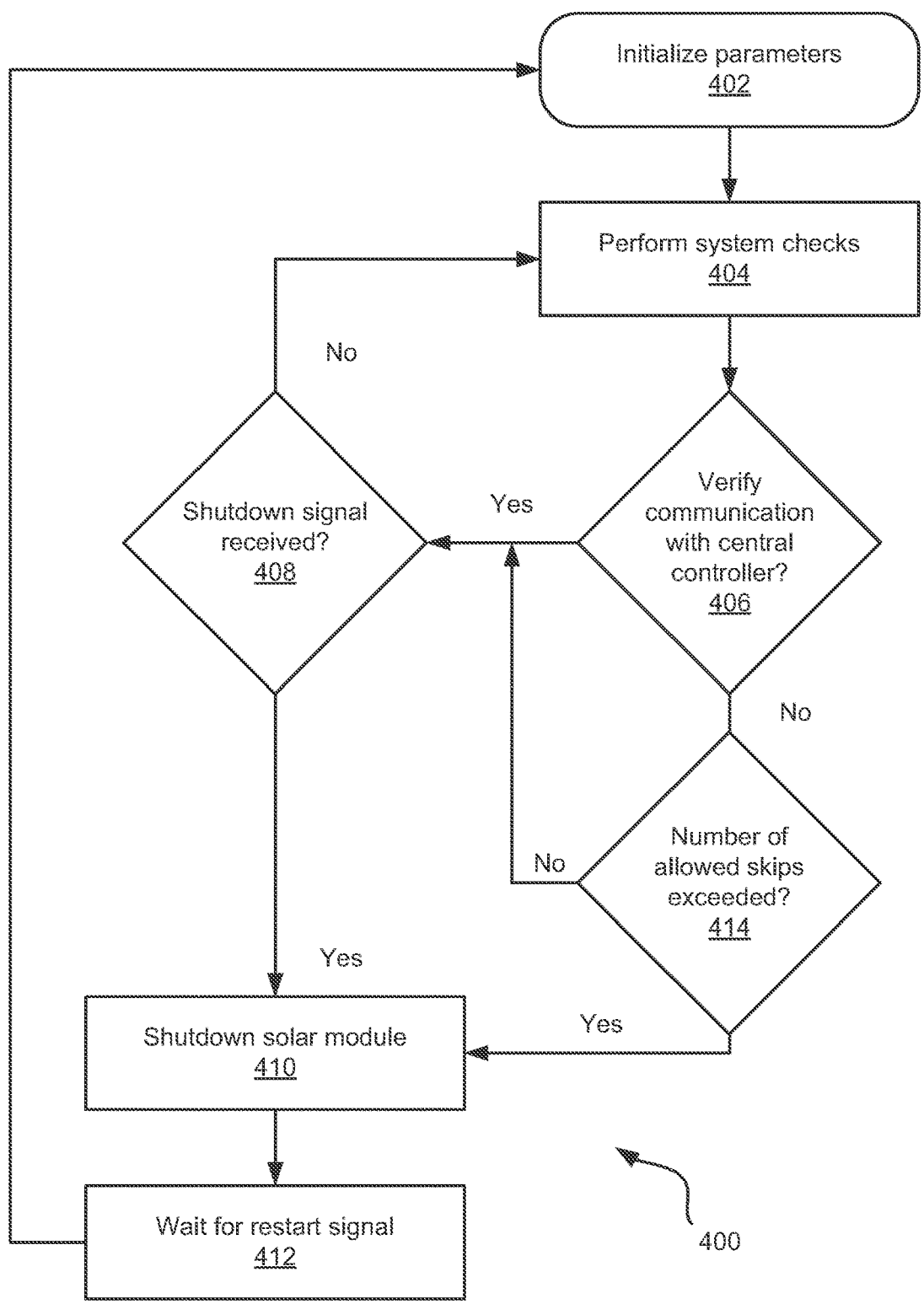
FIG. 4 illustrates an embodiment of a method of controlling the output of a solar module.

FIG. 4 illustrates an embodiment of a method of controlling the output of a solar module. The method 400 may be computer-implemented, and each of the operations discussed below can be carried out via a computing device. The method 400 begins by initializing parameters in an initialize parameters operation 402. System checks are then performed in a perform system checks operation 404. The method 400 then verifies communication with a central controller via a verify communication decision 406. If communications with the central controller are verified, then the method 400 looks for a shutdown signal in a shutdown signal received decision 408. If a shutdown signal is not received, then the method returns to the perform system checks operation 404. If a shutdown signal is received, then the method 400 shuts down the solar module in shutdown operation 410. The method 400 then waits for a restart signal from the central controller in the wait for restart signal operation 412. Once the restart signal is received, the method returns to the initialize parameters operation 402.

Turning back to the verify communication decision 406, if communication with the central controller is not verified, then the method 400 waits to verify communication. If communication is verified in less than an allowed number of "skips," as determined by a number of allowed skips exceeded decision 414, then the method 400 looks for a shutdown signal in the shutdown decision 408. The method 400 then continues from the shutdown decision 408 as previously described. However, if communication is not verified by the time the number of skips is exceeded, as determined by the number of allowed skips exceeded decision 414, then the method 400 turns to the shutdown operation 410 and shuts the solar module down (disconnects one or more solar modules from the power bus or lowers one or more solar module voltages to safe levels). The method 400 then continues from the shutdown operation 410 as previously described.

The method 400 begins with the initialize parameters operation 402. Parameters are used in the perform system checks operation 404, as reference points for the system checks. Parameters can thus include values describing any of the systems or devices that the perform system checks operation 404 may look at. For instance, the types of wiring, proper voltages in the wires, proper currents in transistors, expected signals from the central controller, number of allowed skips, what the shutdown signal looks like, and how much time can elapse before an irregular signal is considered interrupted are just some of the parameters that can be used. Parameters can be stored in a storage medium, preferably a non-volatile storage medium such as electrically erasable programmable read-only memory (EEPROM), read-only memory (ROM), and flash.

The method 400 then performs system checks in the perform operation 404. System checks compare the parameters to measured values. Some non-limiting examples of things that can be measured include, types of wiring, voltages in the wires, currents in transistors, signals from the central controller, number of skips, the shutdown signal, and elapsed time of interrupted signals, to name a few. For instance, a parameter initialized in the initialize operation 402 may indicate that the voltage produced by the panel should be around 30V plus or minus 5V. If the system check finds the voltage to be 29V, then everything is acceptable. However, if the voltage were 24V or any other value below 25V, then the system check might provide a warning to the central controller or take some other remedial action.

Once system checks have been performed, the method 400 tries to verify communication with the central controller in the verify decision 406. Verifying communication includes monitoring a communication from the central controller and ensuring that there are no problems with the communication. For instance, ensuring that the voltage of the communication is above a certain threshold (e.g., within 10% of maximum power), ensuring that a certain number of pulses are received within a certain period of time (e.g., at least one hundred pulses per second), or ensuring that communication is not lost for longer than a threshold period of time (e.g., communication is not verified if lost for more than three seconds), to name a few. In an embodiment, verifying communication can include receiving a communication within a set time from when a last communication was received. For instance, if communications are supposed to be received every two seconds, and there is a three second gap between receipt of two consecutive communications, the method 400 may determine that communication has not been verified. The signal or communication from the central controller can be transmitted via wireless or wired means. In an embodiment, verifying communication can be an active rather than passive operation. For example, a signal such as a challenge can be sent to the central controller, and the communication is not verified until a response is received.

If communication is verified, then the method 400 determines if a shutdown signal has been received in the shutdown signal received operation 408. A shutdown signal can replace the signal that is being monitored. Alternatively, the shutdown signal can be overlaid or multiplexed onto the signal being monitored. The shutdown signal can be initiated by automatic means, such as a fire alarm. The shutdown signal can be initiated by manual means, such as a fireman pushing an emergency shutdown button at the breaker box on a house that is burning.

If the shutdown signal is not received, then the method 400 can loop back to the perform system checks operation 402 as illustrated. Alternatively, the method 400 can continue to verify communication with the central controller via the verify decision 406. If the shutdown signal is received, then the method 400 shuts the solar module down in the shutdown operation 410. Shutdown may include using a watchdog and/or switchable connection to disconnect the solar module from the power bus. Shutdown may include using a watchdog and/or switchable connection to lower the solar module voltage to a safe level.

After shutdown, the method 400 waits for a restart signal. The restart signal is a signal from the central controller that is transmitted via the same wireless or wired means that communicates the originally monitored signal. The restart signal may be automatically transmitted when certain conditions are met or may be manually initiated. For instance, at the end of a fire or after a home has been fixed after a fire, maintenance personnel may flip a manual switch near the fuse box to initiate the restart signal. In an embodiment where the system is running off of a limited backup power source, the backup power source may run down while the method 400 waits for the restart signal. In this case, the method 400 can initiate a full shutdown. The full shutdown may include turning off all systems which are still operational. When the restart signal is received, the method 400 can loop back to the initialize parameters operation 402.

Returning now to the verify communication decision 406, if communication with the central controller cannot be verified, then the method 400 may continue trying to verify communication until a threshold is surpassed. This continued attempt to verify takes place via the number of skips allowed decision 414. Skips refers to the event of missing a communication or pulse. If a communication or pulse should be received every second, but one pulse is not received, then a skip has occurred. For example, if a communication or pulse is not received for five seconds, then four skips have occurred. Additionally, the threshold can take many forms. For instance, the threshold can be a number of skips. The threshold can be a time period in which communication cannot be verified. The threshold can be a number of missed pulses or a number of pulses having less-than-expected amplitude. These are just a few non-limiting examples of the plethora of thresholds that can be used in the number of allowed skips decision 414. The threshold values can be extracted from or read from a storage medium. The storage medium can be the same one that stores parameters, or it can be a separate storage medium. In either case, non-volatile memory can be used so that the threshold values can still be accessed even after power is lost.

When the threshold is surpassed (or number of skips is exceeded) the method 400 moves to the shutdown and wait operations 410, 412. However, if the threshold is not surpassed (e.g., communication with the central controller is lost, but resumes before the threshold is surpassed), then the method 400 determines if the communication (or signal) includes a shutdown signal via the shutdown decision 408.

One skilled in the art will recognize that the order of operations of the method 400 can be varied without departing from the spirit of the disclosure. At the bare minimum the method 400 requires the verify communication decision 406 along with the shutdown operation 410. Thus, in the broadest sense, the method 400 is about monitoring communication from the central controller, verifying the communication, and shutting the solar module down when the communication cannot be verified. Any one or more of the other operations and decisions can be added to this basic set of decision 406 and operation 410. As for different orders of operation, the method 400 can look for the shutdown signal via the shutdown decision 408 concurrently with the verify decision 406 or before the verify decision 406. The number of allowed skips exceeded decision 414 may also operate before, after, or concurrently with the shutdown decision 408. Furthermore, once a restart signal has been received, the method 400 may loop back to the verify decision 406 rather than the initialize and perform operations 402, 404.

Figure 5:
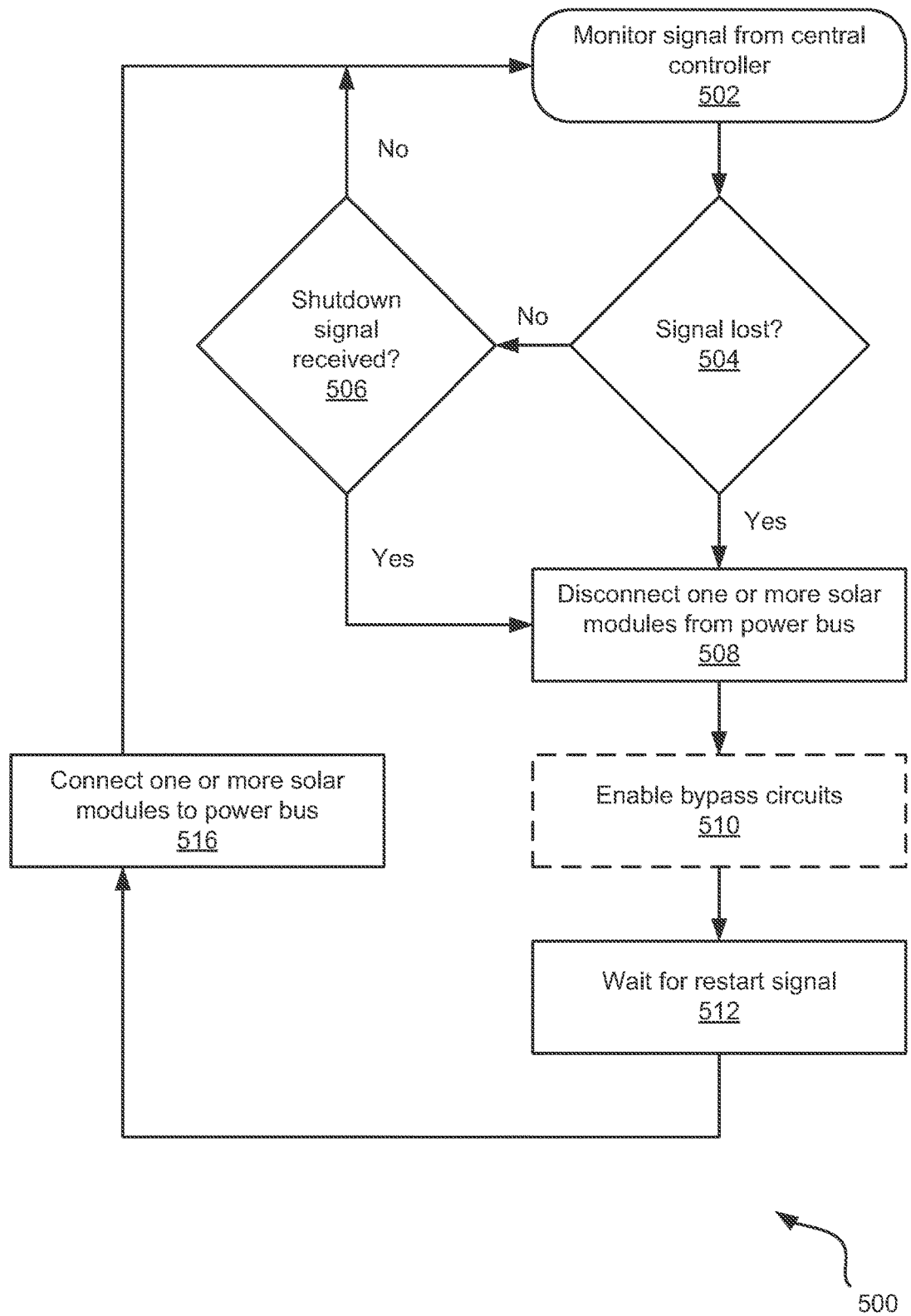
FIG. 5 illustrates another embodiment of a method of controlling the output of a solar module.

FIG. 5 illustrates another embodiment of a method of controlling the output of a solar module. The method 500 may be computer-implemented, and each of the operations discussed below can be carried out via a computing device. The method 500 monitors a signal from a central controller in a monitor operation 502. The method 500 determines if the signal has been lost via a signal lost decision 504. If the signal is lost, then one or more solar modules are disconnected from a power bus via a disconnect operation 508. Disconnect means that a switchable connection has a reduced duty cycle such that the voltage provided to the power bus by the solar module is reduced. In an embodiment, the switchable connection can have a duty cycle of 0%, always open, such that no voltage is provided to the power bus. The method 500 may also determine if the signal includes a shutdown signal via a shutdown signal received decision 506. If the signal includes a shutdown signal, then the method 500 disconnects one or more solar modules from the power bus via the disconnect operation 508. If a shutdown signal is not received, then the method 500 continues to monitor the signal from the central controller via the monitor operation 502. When the one or more solar modules are disconnected from the power bus, the method 500 may optionally enable a bypass circuit via an enable bypass circuit operation 510. The bypass circuit allows current to continue to flow in the power bus when the one or more solar modules are disconnected from the power bus. The method 500 may then wait for a restart signal via a wait operation 512. The method 500 continues to wait for the restart signal until the restart signal is received or until a backup power source (e.g., battery or capacitor) runs out, assuming the primary power source is not available. If the backup power source runs out, then the method 500 initiates a full shutdown. If the restart signal is received, then the method 500 can connect the one or more solar modules to the power bus via a connect operation 516.

By lost signal, it is meant that the signal amplitude is not great enough to surpass an amplitude threshold or that the signal has become so irregular as to surpass an irregularity threshold. For instance, if only ten out of a hundred pulses have been received (assuming a pulsed signal), then the signal may be considered lost.

In an embodiment, watchdog units can be coupled between each solar module and the power bus. The watchdog units can be configured to monitor a signal from a central controller and disconnect the solar modules from the power bus if the signal is lost or if the signal includes a shutdown signal. However, there may not be a watchdog unit for each solar module. In such an embodiment, solar modules that are not coupled to a watchdog unit may not be disconnected from the power bus.

Disconnecting one solar module from the power bus may include a complete disconnection, as for example performed via the opening of a mechanical or electronic switch. However, disconnecting can also include lowering the voltage (e.g., lowering a duty cycle of a switch). One skilled in the art will recognize that the order of operations of the method 500 can be varied without departing from the spirit of the disclosure.

It is clear that many modifications and variations of these embodiments may be made by one skilled in the art without departing from the spirit of the novel art of this disclosure. For example, instead of including the watchdog units with the junction boxes, the watchdog units can be a part of local management units (LMU's) that are also responsible for balancing the currents between solar modules in a power bus and are responsible for balancing the voltages between power buses in a solar array. These modifications and variations do not depart from the broader spirit and scope of the invention, and the examples cited herein are to be regarded in an illustrative rather than a restrictive sense.

What is claimed is:

1. A photovoltaic system, comprising:
   a power bus;
   a central controller;
   an inverter coupled between the power bus and a power grid; and
   a plurality of photovoltaic modules, each respective photovoltaic module of the photovoltaic modules having a watchdog unit coupled between the respective photovoltaic module and the power bus, the watchdog unit comprising:
      a converter configured to convert power generated by the respective photovoltaic module for the power bus;
      a communication connection to the central controller;
      a local controller; and
      at least one switch coupled between photovoltaic cells of the respective photovoltaic module and the power bus;
   wherein the local controller is configured via hardware, or software, or combination of hardware and software to:
      receive, over the communication connection, a communication from the central controller;
      determine whether the communication connection containing a shutdown command;
      control the at least one switch to disconnect the converter from the power bus, in response to the communication containing a shutdown command;
      determine whether the communication from the central controller has been interrupted for a time period longer than a predetermined number of allowed skips, when the communication contains no shutdown command;
      control the at least one switch to connect the converter to the power bus, in absence of a determination by the local controller that the communication from the central controller has been interrupted for a time period longer than the predetermined number of allowed skips; and
      control the converter to lower an output of the converter to the power bus to below a predetermine threshold in response to a determination by the local controller that the communication from the central controller has been interrupted for a time period longer than the predetermined number of allowed skips.

2. The photovoltaic system of claim 1, wherein the communication from the central controller is via a wired connection.

3. The photovoltaic system of claim 1, wherein the communication from the central controller is via a wireless connection.

4. The photovoltaic system of claim 1, wherein the local controller controls a duty cycle of the at least one switch to control an output voltage of the respective photovoltaic module.

5. The photovoltaic system of claim 2, wherein the local controller is powered by the respective photovoltaic module.

* * * * *